United States Patent [19]

Lesh, deceased et al.

[11] 4,109,297

[45] Aug. 22, 1978

[54] CONDUCTION SYSTEM FOR THIN FILM AND HYBRID INTEGRATED CIRCUITS

[75] Inventors: Nathan George Lesh, deceased, late of Bethlehem, Pa.; by Merchants National Bank of Allentown, executor, Lehigh County, Pa.; Joseph Michael Morabito, Bethlehem, Pa.; John Henry Thomas, III, Pickerington, Ohio

[73] Assignee: Bell Telephone Laboratories, Incorporated, Murray Hill, N.J.

[21] Appl. No.: 781,294

[22] Filed: Mar. 25, 1977

Related U.S. Application Data

[62] Division of Ser. No. 576,711, May 12, 1975, Pat. No. 4,016,050.

[51] Int. Cl.$^2$ .............................................. H05K 1/04
[52] U.S. Cl. ...................................... 361/402; 204/15; 204/40; 357/71; 427/125
[58] Field of Search ........................ 361/402; 357/71; 204/15, 40, 192; 29/195, 198, 199; 427/123-125, 404, 383, 271, 383 A, 283 B, 99

[56] References Cited

U.S. PATENT DOCUMENTS

| 3,287,612 | 11/1966 | Lepselter | 357/71 |
| 3,576,415 | 4/1971 | Gwyn, Jr. | 200/166 |
| 3,576,722 | 4/1971 | Fennimore et al. | 204/15 |
| 4,068,022 | 1/1978 | Glick | 427/125 |

FOREIGN PATENT DOCUMENTS

2,108,730   9/1971   Fed. Rep. of Germany.

OTHER PUBLICATIONS

Mino, et al., "Laser Cut Microwave Thin Film Circuits", Solid State Technology, Aug., 1974, pp. 37-40.
Antler, "Gold-Plated Contacts: Effect of Heating on Reliability", Plating, vol. 57, pp. 615-618, Jun. 1970.

*Primary Examiner*—David Smith, Jr.
*Attorney, Agent, or Firm*—Lester H. Birnbaum

[57] ABSTRACT

A metallization scheme for interconnection of elements in thin film and hybrid circuits is described. A thin layer of titanium is first formed, preferably by evaporation or sputtering, on the surface of the insulating substrate. A thin layer of copper is then formed in the same manner over the titanium layer. This is followed by electroplating of copper to a desired thickness onto selected portions of the Ti-Cu multilayer. Successive layers of nickel and gold are then selectively electroplated onto the plated copper regions. An additional layer of palladium may also be included between the titanium and copper layers for improved adhesion. The Ti-Cu-Ni-Au metallization system has been found unusually compatible with the major processing requirements of thin film circuits, for example, thermocompression bonding, soldering, via-hole coverage and resistor stabilization.

9 Claims, 3 Drawing Figures

CONDUCTION SYSTEM FOR THIN FILM AND HYBRID INTEGRATED CIRCUITS

This application is a division of application Ser. No. 576,711, filed May 12, 1975 now U.S. Pat. No. 4,016,050.

BACKGROUND OF THE INVENTION

This invention relates to thin film and hybrid integrated circuits, and in particular to a conduction system for interconnecting elements in said circuits.

Thin film and hybrid integrated circuits presently enjoy extensive use in a wide variety of applications, for example, filter circuits and memories for switching and transmission systems. The most widely used metal interconnection system used for such applications is a titanium-palladium-gold multilayer structure. The gold layer provides the major current-carrying load while also serving as a good bonding layer. While such a system has performed satisfactorily, great quantities of gold are required. Typically, the gold layer is approximately 50,000 A thick and must be formed over a substantial area of the interconnect pattern. With the rising cost of gold, the cost of producing such circuits can become excessive.

Finding a replacement for such a system is an exceedingly difficult task. The system must not only provide good conduction and adherence to the substrate, but must also be compatible with the various processing sequences necessary for circuit fabrication, such as thermo-compression bonding, soldering, resistor and capacitor fabrication and stabilization, annealing, etc. The various components of the system must also be compatible, i.e., nonreactive, with each other.

It is therefore a primary object of the invention to provide a metal interconnection system which is less expensive than the presently-used system and at the same time is compatible with the myriad processing requirements of thin film and hybrid circuits.

SUMMARY OF THE INVENTION

This and other objects are achieved in accordance with the invention which provides a metal combination comprising layers of titanium-copper-nickel-gold for interconnection. Copper serves as the primary conductor and gold as a bonding layer, thus significantly reducing the thickness of gold required. Titanium provides good adhesion to the insulating substrate and nickel serves as a diffusion barrier between the copper and gold layers. In addition, a layer of palladium may be provided for greater adhesion between the titanium and copper layers. in accordance with one embodiment of the method of the invention, thin layers of titanium and copper are successively formed over substantially the entire surface of the substrate by evaporation or sputtering. Additional copper is then electro-plated onto the evaporated or sputtered copper in the areas which will comprise the interconnect pattern. A layer of nickel is then electroplated onto the plated copper surface, followed by electroplating gold on the entire nickel surface or, alternatively, only on the areas which will comprise the bonding pads. The areas of titanium and copper which are not covered by the plated metals can then be etched to define the interconnect pattern.

BRIEF DESCRIPTION OF THE DRAWING

These and other features of the invention will be delineated in detail in the description to follow. In the drawing.

DETAILED DESCRIPTION OF THE INVENTION

The method in accordance with two embodiments of the invention is described with reference to the flow diagram of FIG. 1.

Figure 1:
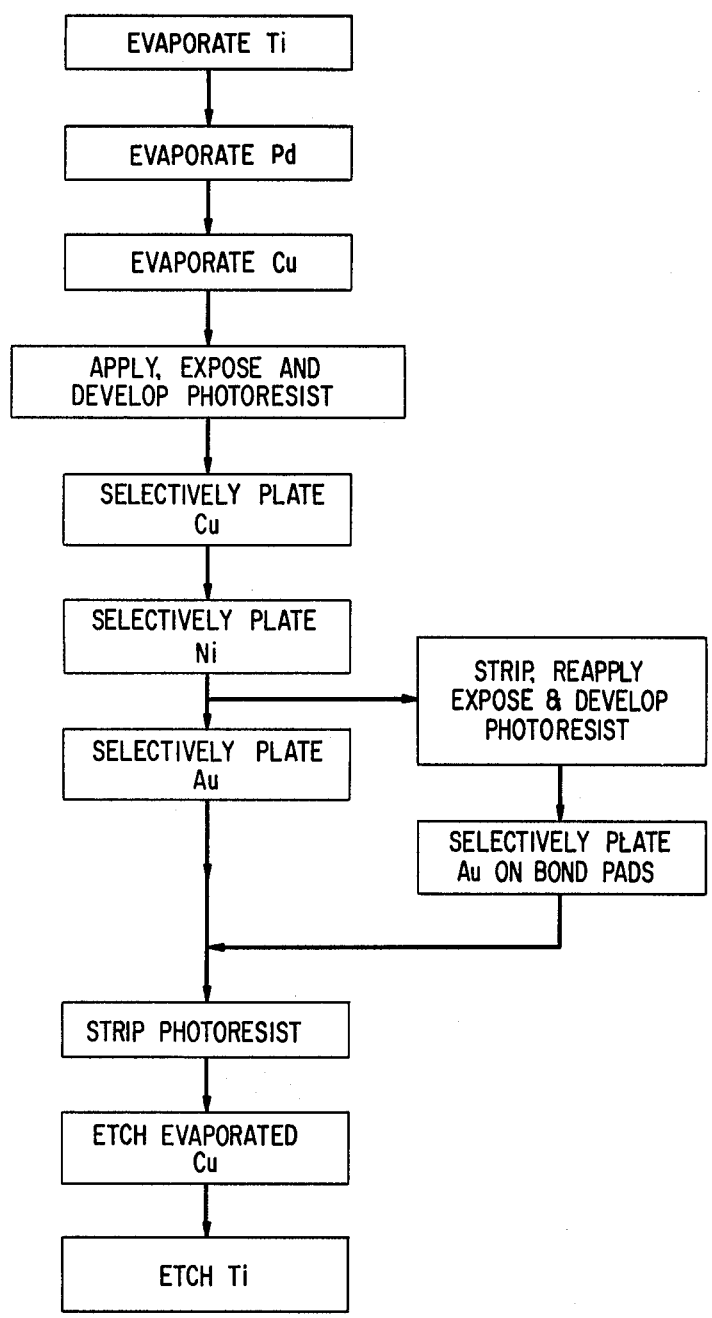
FIG. 1 is a flow diagram illustrating the fabrication steps in accordance with two alternative embodiments of the invention.

The sequence of steps illustrated in FIG. 1 preferably begins after the deposition of the resistor and capacitor elements, usually comprising tantalum or tantalum nitride, on the insulating substrate, which is most usually alumina. The formation of the interconnection scheme began with a deposition of a layer of titanium over substantially the entire area of the substrate. The precise method employed was electron gun evaporation, however, other well-known techniques such as sputtering may be employed. The thickness of the titanium layer is preferably within the range 1,500–3,000 A in order to serve as an adequate glue layer and to avoid bondability problems which usually occur when the thickness is less than approximately 1,500 A. A thickness of approximately 2,500 A seems to be optimum. Next, a thin (approximately 500 A) layer of palladium was deposited, preferably by the same technique, on the titanium layer. This layer serves to improve adhesion between the titanium and the to be described copper layer. As such, the palladium layer is optional since the adhesion of Ti and Cu can be adequate if proper deposition procedures are followed. An appropriate thickness for this layer appears to be 200 – 1,000 A. It should be noted that the increased adherence of copper and titanium due to the insertion of a palladium layer is quite surprising because a noble metal usually does not provide a strong bond with a non-noble metal. The reason for this effect is not understood, and is presently being investigated.

Next, a thin layer of copper was deposited, in this embodiment also by electron gun evaporation, on the Pd layer. The copper layer serves primarily to provide a high conductivity layer for subsequent plating processes. Typically, the layer is approximately 5,000 A in thickness, but a range of approximately 3,000 – 7,000 A would be appropriate.

Before proceeding with the photoresist step, it is desirable to coat the copper surface with a thin chrome layer to improve the adherence of the photoresist. This procedure is well-known in the art. The photolithographic process, also well-known in the art, involves essentially applying a photoresist layer to the entire copper surface, exposing desired areas through a mask, and developing the resist to remove those areas exposed to light in a pattern which will define the appropriate interconnection paths. The particular photoresist used was manufactured by Shipley and sold under the trade name AZ-340B, but many other well-known resists will suffice.

As shown in FIG. 1, a layer of copper was then electroplated onto the selected portions of the evaporated copper layer not covered by the photoresist. This was accomplished by making the substrate the anode in an electrolytic cell wherein the bath comprised approximately 68 gms/liter of $CuSO_4$ and 180 gms/liter of $H_2SO_4$. It was found that this particular bath was optimum for complete coverage of the copper layer, but the proportions can be adjusted to fit particular needs. It should also be realized that other baths may be employed for Cu plating, but at the present time the copper sulphate bath appears optimum. The plating was carried out at a current density of approximately 20 $mA/cm^2$, but again this parameter may be adjusted depending upon the quantity of the bath and the geometry of the circuit to be fabricated. The thickness of the copper layer is an important consideration. In this particular embodiment, the total thickness of evaporated and plated Cu was approximately 35,000 A. The appropriate range of thickness in association with those of the subsequent Ni and Au layers is discussed later. An important point to realize is the fact that exposure of the copper surface to air for prolonged periods causes the surface to oxidize resulting in poor adherence. Therefore, the copper plating operation should follow the copper evaporation, and the subsequent Ni plating should follow the copper plating, while the copper is still wet.

In the next step, nickel was plated onto the exposed areas of the plated copper surface. Th particular bath used for this plating operation is sold by Allied-Kelite Co. under the trade name Barrett type SN and basically comprises nickel sulfamate and boric acid. The thickness of the nickel layer was approximately 10,000 A, although a useful range appears to be approximately 8,000 - 20,000 A for providing an adequate diffusion barrier between the plated copper and the subsequently deposited gold layer, while maintaining a proper sheet resistivity as described later. A layer thickness below approximately 8,000 A will result in a porous film which will not block diffusion of Cu and Au at the high temperatures required in subsequent thin film processing. Thus, the thickness of this layer is an important parameter. The current density employed was, again, approximately 20 $mA/cm^2$ which provides a sufficiently dense film. As before, the current density may be adjusted for particular needs. A minimum current density for the nickel film fabrication appears to be approximately 10 $mA/cm^2$ to produce a sufficiently dense film (of the order of 9 $gms/cm^3$).

It was also discovered that an optimum barrier layer is one which consists of essentially pure Ni without any additives.

At this point in the processing, as shown in FIG. 1, basically two alternatives may be followed in forming the top layer of gold. In the first alternative, the photoresist layer previously formed on the substrate was utilized as the mask for electroplating the gold layer on the entire exposed area of the previously formed nickel layer. In the second alternative, this photoresist layer was stripped off and a second photoresist was applied, exposed and developed to expose only those areas of the metal which will be utilized as bonding pads for integrated circuit chips or connection to elements off the substrate. In either procedure, the electroplating processes utilized a gold cyanide bath comprising 20 gms/liter of potassium gold cyanide, 50 gms/liter of ammonium citrate and 50 gms/liter ammonium sulfate at a current density of approximately 2 $mA/cm^2$. Again, the proportions of the bath components and the current density may be adjusted as needed. The thickness of the gold layer was approximately 20,000 A, but it appears that a preferred range is 15,000 - 25,000 A to insure a good bonding surface. It will be realized that the thickness of gold required in this conduction system is considerably less than that required in the previous Ti-Pd-Au system which was approximately 50,000 A. Thus, a substantial cost savings is realized in accordance with the invention. It will also be realized that while the embodiment involving selective plating in the bonding areas suffers from the disadvantage of requiring an extra photoresist layer, it offers an advantage in requiring less gold and permits further cost savings.

The next processing sequence involves final patterning of the interconnect scheme by etching the evaporated layers of Cu and Ti which are not covered by the plated metal layers. Thus, the photoresist utilized during electroplating was first striped off. In both alternative embodiments the evaporated copper was removed by an ammonium persulfate solution and the titanium layer was subsequently removed by hydrofluoric acid, which solutions are known in the art. Care should be taken in removal of the evaporated copper to avoid nickel etching and undercutting of the plated copper layer. Typically, etch time for removal of 5,000 A of copper in ammonium persulfate is approximately 60 seconds. As a precautionary measure, the circuits were removed from the etchant as soon as all visible signs of copper were removed and immediately rinsed to stop futher etching. It will be realized that other etchants may be employed for removal of the Ti and Cu layers.

As alluded to previously, the thicknesses of the Cu, Ni, and Au layers are important in providing the proper sheet resistivity for replacement of the Ti-Pd-Au system. In particular, a desired sheet resistant ($R_s$) can be calculated from the equation:

$$R_s = (1/(t/\rho)_{Au} + (t/\rho)_{Cu} + (t/\rho)_{Ni}) \qquad (1)$$

where $t$ is the thickness and $\rho$ the bulk resistivity of the indicated metals. An end of life sheet resistance of approximately 0.005 ohms/square or less is desired for most applications. Thus, for a Ni layer in the range of 8,000 - 20,000 A and Au in the range of 15,000 - 25,000 A, a range of Cu thickness of 25,000 - 40,000 A appears to be optimum to satisfy sheet resistance requirements.

Figure 2:
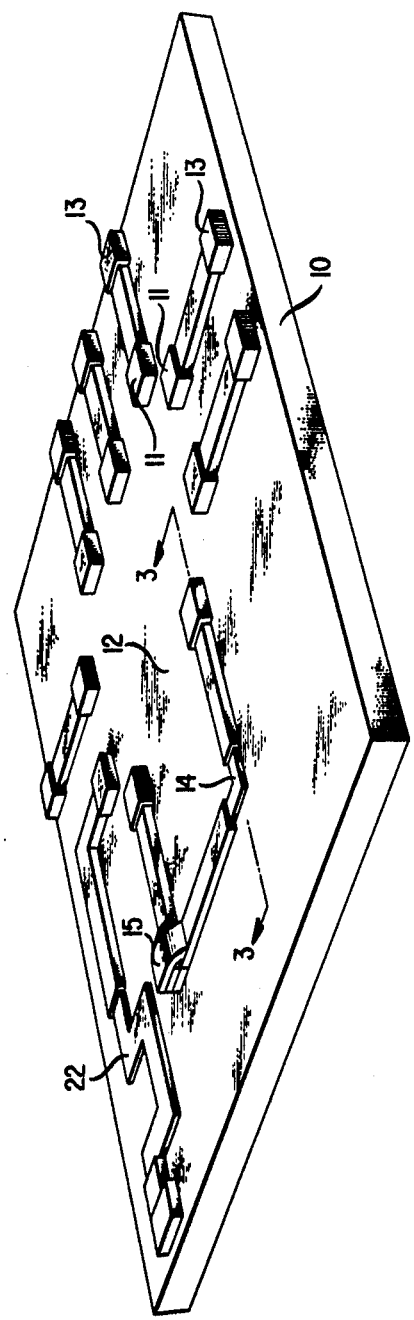
FIG. 2 is a perspective view of a thin film circuit which has been fabricated in accordance with one embodiment of the invention.

After formation of the interconnect pattern as described above, normal circuit processing such as resistor patterning, thermocompression bonding, soldering, etc., proceeds in accordance with the prior art. FIG. 2 gives a perspective view of a simple thin film circuit just after interconnection formation in accordance with the invention and prior to the above-mentioned processing. It should be realized that this circuit is presented primarily for illustrative purposes and the present interconnect scheme may be utilized for all types of circuits. It will also be realized that this circuit is not necessarily drawn to scale.

Figure 3:
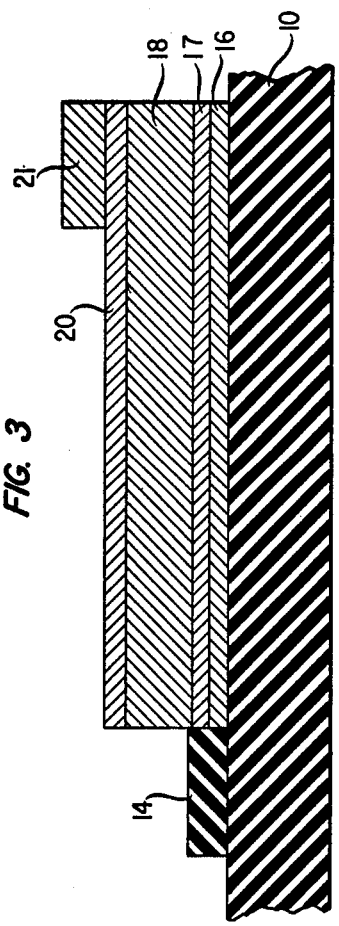
FIG. 3 is an enlarged cross-sectional view taken along line 3—3 of FIG. 2.

The elements are formed on a ceramic board indicated as 10. Bonding pads, such as 11 formed in the interior define the area of the board 12 where the integrated circuit chip (not shown) may be placed. Bonding pads such as 13 formed near the edges permit bonding of the circuit to elements off the board. The circuit shows simply a first resistor element 22, and a second resistor element 14 in series with a capacitor element 15, the resistor element usually comprising tantalum nitride and the capacitor comprising a tantalum-tantalum oxide-conductor multilayer structure as well-known in the art. The interconnections between bonding pads and circuit elements are made in accordance with the invention. An enlarged cross-sectional view taken along line 3—3 is illustrated in FIG. 3. The evaporated titanium layer is shown as 16, and the palladium layer as 17. The copper layer which was formed by first evaporating a thin layer and then electroplating is illustrated as 19 with the plated nickel layer formed thereon indicated as 20. It will be seen that the Au layer 21 is formed only in the areas where bonding is desired in accordance with the second alternative embodiment previously described. It will be appreciated that during the subsequent heat treatments some alloying of Cu, Ni and Au will take place primarily at the boundaries of the Ni layer. It is believed that the basic Cu-Ni-Au multilayer structure will be maintained.

In this regard, one of the significant and surprising features of this metal interconnect combination is the fact that the combination is compatible with all the thin film processing sequences required for a complete circuit in spite of the fact that further processing alters somewhat the composition of the interconnect structure.

To demonstrate this compatibility, the Ti-Cu-Ni-Au conduction system was heated at various temperatures and times in accordance with normal circuit processing. For example, films with nickel thicknesses of approximately 10,000 A were heated at 250° C for five hours, which is the temperature and time generally used for Ta$_2$N resistor stabilization. Auger analysis of the resulting structure showed an insignificant amount of diffusion of Cu or Au through the Ni layer and a change in sheet resistance of just 4%. A heat treatment at 150° C for 1,000 hours resulted in no detectable diffusion through the Ni layer and only a 1.5% change in sheet resistance. An upper limit for heat treatment of the system appears to be 350° C for four hours, since in this case considerable interdiffusion took place and sheet resistance change was approximately 17%. These tests demonstrated that the Ti-Cu-Ni-Au conduction system was comparable to Ti-Pd-Au in regard to resistance to damage at the high temperatures required for processing circuits.

The Ti-Cu-Ni-Au system was also subjected to environments of air plus dry and wet HCl, as well as wet NO$_2$ and SO$_2$. In dry HCl, the present system showed the same good corrosion resistance properties as Ti-Pd-Au. In wet environments CHCl, SO$_2$ or NO$_2$), which is a more severe test of resistance to corrosion, the present system showed contact resistance change approximately equal to that in the dry HCl environment.

Thermocompression bonding to thin film circuits is usually performed after all high temperature processing is completed. Thus, to test compatibility of the present system with regard to bonding, it was necessary to subject the metals to high temperature for prolonged periods of time. The system, with Ni layers varying in thickness between 2,000 - 10,000 A was subject to different heat treatments at 150°, 250°, 300°, and 350° C, followed by bonding and testing of pull strength. Maximum pull strengths were generally obtained for the 10,000 A Ni layer system and adequate strengths were observed after treatments of 150° C up to 1,000 hrs., 250° C up to 10 hours, 300° C up to 4 hrs., and 350° C up to 2 hrs. A minimum time of 30 minutes is suggested. In general, the pull strength for the present conduction system was shown to be essentially the same as the Ti-Pd-Au system similarly treated. The tests thus showed that thermocompression bonding is possible after heating Ti-Cu-Ni-Au at 300° C for 4 hours, which is the treatment currently used to cure the insulating layer used in plated crossovers and at 350° C for up to 2 hours which is the treatment suggested for resistor stabilization prior to laser trimming, where the Ni layer was approximately 10,000 A.

Another surprising feature of the present conduction system was its compatibility with soldering procedures. Soldering of the Ti-Pd-Au system with conventional Sn-Pb solders results in the formation of brittle Sn-Au intermetallics. However, with the present system, the gold layer is sufficiently thin such that no brittle intermetallics are formed. Furthermore, the gold protects the surface of the Ni from oxidation thus allowing the Ni surface to be wetted readily by the solder. The dissolution rate of the Ni into the solder is slow enough to insure adequate time to solder and desolder for making repairs.

Various additional modifications of the present invention will become apparent to those skilled in the art. All such variations which basically rely on the teachings through which the invention has advanced the art should properly be considered within the spirit and scope of the invention.

What is claimed is:

1. A circuit including thin film elements and electrical interconnections of a desired resistivity on the major surface of an insulating substrate, said interconnections comprising:
    a first metal layer comprising titanium with a thickness in the range 1,500–3,000 A formed on said substrate;
    a second metal layer comprising copper with a thickness in the range 25,000–40,000 A formed over said first metal layer;
    a third metal layer comprising nickel with a thickness in the range 8,000–20,000 A formed on said second layer; and
    a fourth metal layer comprising gold with a thickness in the range 15,000–25,000 A formed on at least portions of said third metal layer.

2. The circuit according to claim 1 wherein the interconnections have a resistivity no greater than 0.005 ohms/square.

3. The circuit according to claim 1 wherein the fourth layer is formed on substantially the entire surface of said third layer.

4. The circuit according to claim 1 wherein the fourth layer is formed only on the portions of said third layer which comprise the bonding pads for said circuit.

5. A circuit including thin film elements and electrical interconnections of a desired resistivity on the major surface of an insulating substrate, said interconnections comprising:
    a first metal layer comprising titanium formed on said substrate;
    a second metal layer comprising palladium formed on said first metal layer;
    a third metal layer comprising copper formed on said second metal layer;
    a fourth metal layer comprising nickel formed on said third metal layer; and
    a fifth metal layer comprising gold formed on at least portions of said fourth metal layer.

6. The circuit according to claim 5 wherein said first metal layer has a thickness within the range 1,500–3,000 A, said second metal layer has a thickness within the range 200–1,000 A, said third metal layer has a thickness within the range 25,000–40,000 A, said fourth metal layer has a thickness within the range 8,000–20,000 A, and said fifth metal layer has a thickness within the range 15,000–25,000 A.

7. The circuit according to claim 5 wherein the fifth metal layer is formed on substantially the entire surface of said fourth metal layer.

8. The circuit according to claim 5 wherein the fifth metal layer is formed only on the portions of said fourth metal layer which comprise the bonding pads for said circuit.

9. The circuit according to claim 5 wherein the resistivity of the electrical interconnections is not greater than 0.005 ohms/square.

* * * * *

UNITED STATES PATENT AND TRADEMARK OFFICE
CERTIFICATE OF CORRECTION

PATENT NO. : 4,109,297
DATED : August 22, 1978
INVENTOR(S) : Nathan G. Lesh, deceased, Joseph M. Morabito and John H. Thomas III It is certified that error appears in the above-identified patent and that said Letters Patent are hereby corrected as shown below:

Column 4, line 19, "striped" should read --stripped--; line 39, the equation reading $$"R_s = (1/(t/p)_{Au} + (t/p)_{Cu} + (t/p)_{Ni}) \quad (1)"$$

should read $$--R_s = \frac{1}{(t/p)_{Au} + (t/p)_{Cu} + (t/p)_{Ni}} \quad (1)--.$$

Column 5, line 1, "cpacitor" should read --capacitor--; line 9, "19" should read --18--; line 50, "CHCl," should read --(HCl,--.

Signed and Sealed this

Twenty-fourth Day of July 1979

[SEAL]

Attest:

LUTRELLE F. PARKER

Attesting Officer

Acting Commissioner of Patents and Trademarks